United States Patent [19]

Patel et al.

[11] 4,433,342
[45] Feb. 21, 1984

[54] AMORPHOUS SWITCHING DEVICE WITH RESIDUAL CRYSTALLIZATION RETARDATION

[75] Inventors: Vipin N. Patel, Melbourne; John L. Conarroe, Jr., Melbourne Beach, both of Fla.

[73] Assignee: Harris Corporation, Melbourne, Fla.

[21] Appl. No.: 251,106

[22] Filed: Apr. 6, 1981

[51] Int. Cl.³ .............................................. H01L 45/00
[52] U.S. Cl. ......................................... 357/2; 357/71
[58] Field of Search ...................... 357/2, 59 A, 71, 61

[56] References Cited

U.S. PATENT DOCUMENTS

| | | | |
|---|---|---|---|
| 3,432,729 | 3/1969 | Dyre | 357/2 |
| 3,588,639 | 6/1971 | Fleming et al. | 357/2 |
| 3,611,063 | 11/1971 | Neale | 357/2 |
| 3,877,049 | 4/1975 | Buckley | 357/2 |
| 3,918,032 | 11/1975 | Nicolaides | 357/2 |
| 3,980,505 | 9/1976 | Buckley | 357/2 |
| 4,115,872 | 9/1978 | Bluhm | 357/2 |
| 4,167,806 | 9/1979 | Kumurdjian | 357/2 |
| 4,174,521 | 11/1979 | Neale | 357/2 |
| 4,366,614 | 1/1983 | Kumurdjian | 357/67 |

FOREIGN PATENT DOCUMENTS

| | | | |
|---|---|---|---|
| 2041401 | 9/1972 | Fed. Rep. of Germany | 357/2 |
| 291622 | 7/1971 | U.S.S.R. | 357/2 |

OTHER PUBLICATIONS

Dargan et al., Int. J. Electronics, 1975, vol. 38, No. 6, pp. 711–727.
Grigorovici, "Structure of Amorphous Semicond.", pp. 214–215 of Electronic & Structural Properties of Amorphous Semicond. (Academic Press NY, 1973).

Primary Examiner—William D. Larkins
Attorney, Agent, or Firm—Leitner, Palan, Martin & Bernstein

[57] ABSTRACT

A residual crystallization retardation layer is provided between the non-crystalline switchable semiconductor layer and each electrode structure. Amorphous germanium, silicon or carbon form good crystallization retardation layers and also minimize electromigration and reduce solubility of tellurium in the electrodes.

2 Claims, 3 Drawing Figures

EFFECT OF TEMPERATURE ON CRYSTALLIZATION

AMORPHOUS SWITCHING DEVICE WITH RESIDUAL CRYSTALLIZATION RETARDATION

BACKGROUND OF THE INVENTION

The present invention relates generally to amorphous memory devices and more specifically to an improved structure of amorphous memory devices which minimizes electromigration and retards residual crystal growth.

Amorphous semiconductor memory devices, for example a tellurium base chalcogenide glass, are well known. These memory devices are generally bistable devices having a layer of memory semiconductor material capable of being switched from a stable high resistance condition into a stable low resistance condition when a write or set voltage pulse of relatively long duration (e.g., $\frac{1}{2}$-100 milliseconds or more) is applied. Such a set voltage pulse causes current to flow in a small filament (generally under 10 microns in diameter). The set or write current pulse generally heats regions of the semiconductor material above its glass transition and to its crystallization temperature. The consequence is that the material crystallizes around and in the region of the conducting filament. A crystallized low resistance filament remains indefinitely, even when the applied voltage and current are removed, until reset or erased to its initial amorphous high resistance condition.

The set crystallized filament in the semiconductor materials can generally be erased or reset by applying one or more reset current pulses of relatively short duration in the order of 10 microseconds. The reset or erase current pulses heat the entire filament of the semiconductor material to a temperature above the crystallization and melting temperatures of the material. In this condition, the crystalline filament is melted or otherwise reformed into the original amorphous mass. When such a reset current pulse is terminated, the material quickly cools and leaves a generally amorphous composition like the original one. Sometimes, it takes a number of reset current pulses to convert a previous set filament to what appears to be a fully reset state.

While the resistance and threshold voltage values of a reset filament region may indicate it has apparently been fully reset to its original amorphous composition (except for some non-resettable crystallites which ensure that subsequent crystalline filaments are formed in the same place), the reset filament region often is non-homogeneous, with the crystallizable elements like tellurium in various degrees of concentration.

By electromigration during the reset current, the tellurium builds up progressively greater thicknesses of crystalline tellurium next to one of the electrodes involved and therefore progressively reduces the threshold voltage value of the memory switch device. The deposition of tellurium during the reset operations and the preferential ability of tellurium crystallites to grow at the metal/tellurium interface provides nucleation sites which further increase the fractional volume of crystallites in the device. Not only is the threshold value of the device degradated, but sufficient residual crystallization builds up after many set-reset cycles such that the device is continuously on or set and may not be reset.

To prevent threshold degradation due to electromigration, it has been suggested in U.S. Pat. No. 4,115,872 to provide a layer of substantial tellurium between the germanium telluride switchable layer and the positive electrode and a layer of germanium and tellurium with a higher ratio of germanium than the germanium telluride switchable layer between the switchable layer and the negative electrode. Comparison of the threshold voltage stability as a function of the number of set and reset cycles is illustrated in FIG. 5 of the patent.

Although U.S. Pat. No. 4,115,872 directed itself towards preventing electromigration, the enrichment of tellurium at the electrode creates more nucleation sites. This increases the fractional volume of crystallites as more and larger tellurium crystals are formed during operation. This decreases the number of set-reset cycles before lock-on of the device. Thus there exists a need for an amorphous memory device which has substantially stable threshold voltage and an extended life.

SUMMARY OF THE INVENTION

An object of the present invention is to provide an amorphous memory device and switch with improved lifetime.

Another object of the present invention is to provide an amorphous memory device and switch which minimizes electromigration and residual crystallization.

Another object of the present invention is to reduce the solid state solubility of the electrodes in a germanium telluride amorphous memory device and other non-crystalline switchable semiconductors.

Still another object of the present invention is to provide a germanium telluride amorphous memory device which minimizes the crystallization of the tellurium during the reset process.

These and other objects of the present invention are attained by providing a crystallization, solubility, and electromigration barrier between the non-crystalline switchable semiconductor layer and its respective electrodes. The retarding layer may be selected from the group consisting of germanium, silicon or carbon formed in the amorphous or crystalline state. Preferably the switchable layer is a binary composition of tellurium and germanium although other elements may be included to form a multiconstituent composition. The barrier layer not only prevents electromigration, but reduces residual crystallization by minimizing nucleation sites for the tellurium and its subsequent growth rate. Also, the barrier layer reduces the solubility of the electrodes.

Other objects, advantages and novel features of the present invention will become apparent from the following detailed description of the invention when considered in conjunction with the accompanying drawings.

DESCRIPTION OF THE PREFERRED EMBODIMENTS

As discussed above, the present invention is directed to the amorphous memory devices and switches switchable from a high resistance amorphous state to a low resistance crystalline state. The specific switchable material used is a tellurium-based chalcogenide material which is preferably germanium telluride. As will be discussed below, the unique structure of the present switchable device inhibits residual crystallization of the telluride and thus the addition of crystallization inhibitors such as antimony, bismuth, arsenic, sulfur or selenium need not be used. Thus, preferably the amorphous switchable layer may be a binary composition of germanium and tellurium. If a multiconstituent composition is desired, inhibitors such as sulfur and selenium may be used.

Although the invention will be described in reference to germanium telluride, it is applicable to other non-crystalline switchable semiconductors which include chalcogenide glasses, tetrahedral glasses, tetrahedral amorphous films and semiconducting oxide glasses. Chalcogenide glasses include two-fold coordinated and two dimensionally bonded materials, for example, Se, S, Te, $As_2Se_3As_2S_3$, etc. and cross-linked networks, for example, Ge-Sb-Se, Ge-As-Se, Si-Ge-As-Te, As-Se-Te, $As_2Se_3$-$As_2Te_3$, $Tl_2Se$-$As_2Te_2$, etc. Tetrahedral glasses are $A^{II}B^{IV}C_2^V$, for example, $CdGeAs_2$, $CdSiP_2$, $ZnSiP_2$, $CdSnAs_2$, etc. Tetrahedral amorphous films include Si, Ge, SiC, InSb, GaAs, GaSb, etc. Semiconducting oxide glasses include for example, $V_2O_5$-$P_2O_5$, $V_2O_5$-$P_2O_5$-BaO, $V_2O_5$-$GeO_2$-BaO, $V_2O_5$-PbO-$Fe_2O_3$, MnO-$Al_2O_3$-$SiO_2$, CoO-$Al_2O_3$-$SiO_2$, FeO-$A_2O_3$-$SiO_2$, $TiO_2$-$B_2O_3$-BaO.

Figure 1:
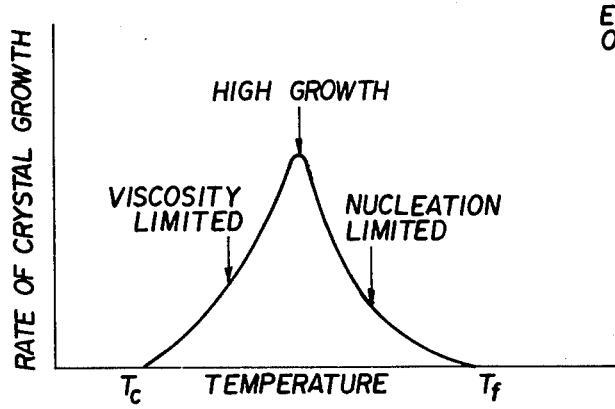
FIG. 1 is a graph of the rate of crystallization of an amorphous material as a function of temperature.

To prevent residual crystallization of tellurium or the formation of crystallites of tellurium during the erase pulse, the mechanism of the erase was investigated. The results of the investigation indicated that the temperature of the switchable material during the erase pulse was in the region of the rate of crystalline growth versus temperature curve of FIG. 1 wherein the rate of crystallization is nucleation limited. Thus a method was sought to minimize the nucleation of the tellurium. The solution of the present invention is to provide barrier layers between the switchable material and the electrode structure to inhibit nucleation of the tellurium.

Figure 2:
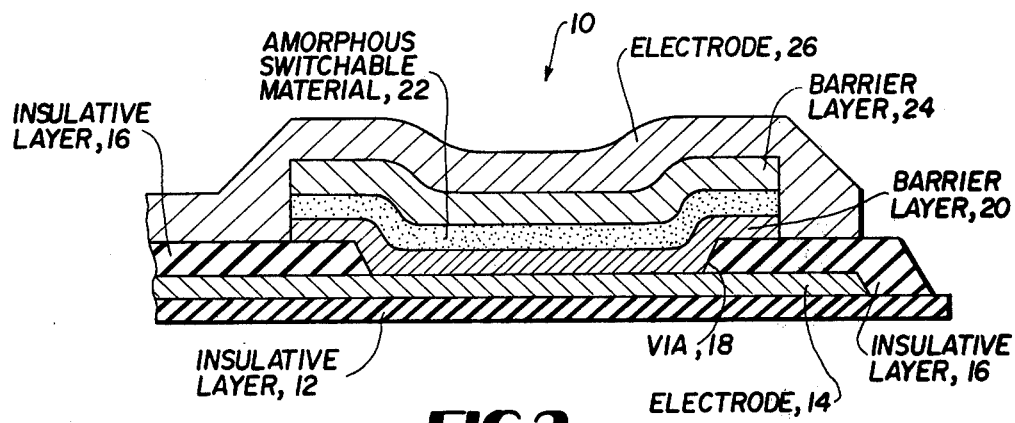
FIG. 2 is a cross-sectional view of an amorphous memory device incorporating the principles of the present invention.

An amorphous semiconductor device 10 is illustrated in FIG. 2 as having an insulative layer 12 and a bottom electrode 14 thereon. An insulative layer 16 covers the electrode 14 and has an opening or via 18 therein. A first barrier layer 20 is formed in the via overlapping the insulative layer 16. An amorphous switchable material layer 22 is then formed on the barrier layer 20. A top barrier layer 24 is formed on the amorphous switchable material 22. The three layers 20, 22 and 24 are delineated. A top electrode 26 is then formed on the barrier layer 24.

The material selected for the barrier layers 20 and 24 preferably is germanium. The germanium layer in an amorphous form creates a supernetwork with the regular shaped particles of high density such that the surface induced crystallization between the germanium layer and the germanium telluride is limited. The germanium can also be in a crystalline state. The germanium layers provide a distinct nucleation surface, simultaneously preventing the successive growth of large tellurium or tellurium rich crystals that lead to device failure. Also the germanium layers have a large density of states at the band gap or fermilevel. The enhanced injection of charges from the barrier layers 20 and 24 into the switchable material 22 compensate for the switching of the switchable layer 22 and enhances the overall performance. As such, the device operates satisfactorily over a broad range of pulse width and amplitudes for the erase operation. The solubility of the electrode in germanium is very low and thus the electrode reliability and lifetime is improved. The properties of amorphous germanium films are discussed in detail in an article by A. Barna et al entitled "Computer Simulation of the Post-Nucleation Growth of Thin Amorphous Germanium Films," *Thin Solid Films* 48 (1978), p. 163–174.

Figure 3:
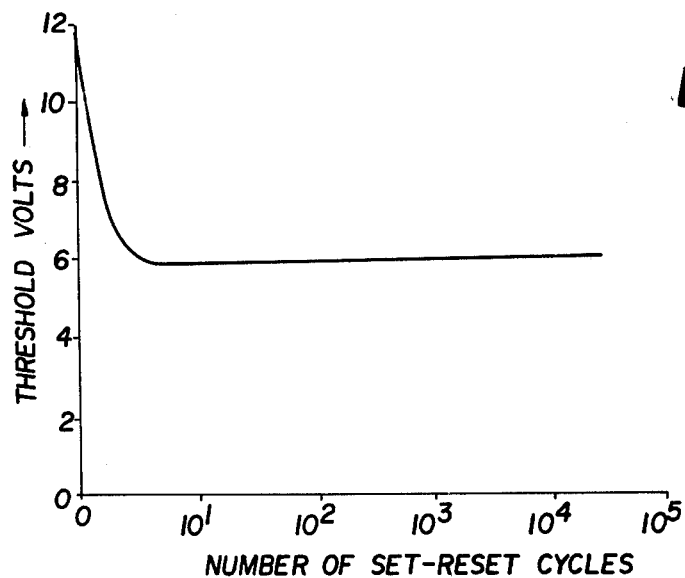
FIG. 3 is a curve of threshold voltage variations as a function of the number of set-reset cycles.

The use of the barrier layers between the switchable material and the electrode structure improves the quality of the metal to amorphous switchable layer interface due to the elimination of catastrophic oxidation in the crystallization of the tellurium. Similarly the adhesion quality of the amorphous switchable film to the electrode is improved. Since tellurium crystallization is minimized, the number of set-reset cycles is extended over prior devices. Another result of the use of the barrier layers is that they minimize electromigration such that the threshold level of the device stabilizes relatively quick and then holds a fixed value for a substantial number of set-reset cycles. The threshold voltage as a function of number of set and reset cycles is illustrated in the graph of FIG. 3. It should also be noted that the switching threshold of the device can be tailored by altering the thickness of the barrier layers 20 and 24.

The electrodes 14 and 26 of the device 10 may be refractory metals, for example, molybdenum or a titanium-tungsten alloy. A highly conductive electrode may include aluminum or gold. The amorphous switchable layer 22 may have a thickness in the range of 2,000 Å to 18,000 Å, and the barrier layers 20 and 24 have a thickness in the range of 20 to 500 angstroms. Although amorphous germanium is the preferred barrier layer, other material such as silicon and carbon may also be used.

It should be noted that the discussion of the device 10 for use as a memory device does not exclude the present principle from being used on a similar device which is a switch versus a memory device. The essence of the present invention is to provide a barrier layer between the non-crystalline switchable semiconductor material and the electrodes to inhibit crystallization, solubility, and electromigration of the tellurium.

As is evident from the detailed description of the preferred embodiments, the objects of the invention are attained in that an improved non-crystalline switchable semiconductor device is provided. Although the invention has been described and illustrated in detail, it is to be clearly understood that the same is by way of illustration and example only and is not to be taken by way of limitation. The spirit and scope of the invention are to be limited only by the terms of the appended claims.

What is claimed:

1. An amorphous semiconductor device switchable from a high resistance amorphous state to a low resistance crystalline state comprising:
    a pair of electrode structures;
    a layer of amorphous germanium telluride forming the switchable layer between said pair of electrode structures; and
    a thin retarding layer of amorphous germanium material between said germanium telluride layer and each electrode structure.

2. The amorphous semiconductor device according to claim 1 wherein each retarding layer has a thickness in the range of 20 to 500 angstroms.

* * * * *